United States Patent
Yao et al.

[19]

[11] Patent Number: 6,052,093
[45] Date of Patent: *Apr. 18, 2000

[54] SMALL OMNI-DIRECTIONAL, SLOT ANTENNA

[75] Inventors: Nian Jing Yao, Mountain View; Vikram Verma, Palo Alto; Patrick Peterson, Mountain View, all of Calif.

[73] Assignee: Savi Technology, Inc., Mountain View, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/987,435

[22] Filed: Dec. 9, 1997

Related U.S. Application Data

[60] Provisional application No. 60/033,115, Dec. 18, 1996.

[51] Int. Cl.⁷ .................................................. H01Q 13/10
[52] U.S. Cl. ............................................. 343/770; 343/767
[58] Field of Search ................................... 343/767, 770, 343/860, 846, 702

[56] References Cited

U.S. PATENT DOCUMENTS

| | | |
|---|---|---|
| 2,507,528 | 5/1950 | Kandoian . |
| 3,736,591 | 5/1973 | Rennels et al. ........................... 343/702 |
| 4,916,457 | 4/1990 | Foy et al. ................................. 343/770 |
| 4,935,745 | 6/1990 | Mori et al. ............................... 343/702 |
| 4,975,711 | 12/1990 | Lee ......................................... 343/702 |
| 5,485,166 | 1/1996 | Verma et al. ............................. 343/744 |
| 5,677,698 | 10/1997 | Snowdon ................................. 343/770 |

FOREIGN PATENT DOCUMENTS

| | | |
|---|---|---|
| 0272145 | 6/1988 | European Pat. Off. . |
| 05110332 | 4/1993 | Japan . |
| 2276274 | 9/1994 | United Kingdom . |

OTHER PUBLICATIONS

"The RADEL™–An Automatic, In–the–Box Visibility System", Technical Proposal PR–1022 (Phase I), dated Nov., 1993, 13 pages.
Government Contract No. N47408–94–C–7412 dated Feb. 8 and Feb. 9, 1994, 13 pages.
RADEL™ Status Report (Phase I), dated Apr. 26, 1994, 39 pages.
RADEL™ Status Report (Phase I), dated Aug. 30, 1994, 37 pages.
Copy of overhead slides from presentation (Phase I) made on Dec. 15, 1994, 30 pages.
"RADEL II™ —A Radio Label Method for Container Manifesting", Technical Proposal No. PR–1025 (Phase II), dated Dec.,1994, with cover letter dated Dec. 27, 1994, 26 pages.
"Radel—A Radio Label Method for Container Manifesting", Final Report (Phase I), dated Mar., 1995, 56 pages.
RADEL II™ —A Radio Label Method for Container Manifesting Project Status Report (Phase II), dated Jun., 1995, 42 pages.

(List continued on next page.)

*Primary Examiner*—Don Wong
*Assistant Examiner*—Tan Ho
*Attorney, Agent, or Firm*—Baker & Botts, L.L.P.

[57] ABSTRACT

This invention discloses a small slot antenna incorporated within a flat circuit board and having a three dimension omni-directional radiation pattern. In one embodiment, the antenna is formed as an L shaped slot along two edges of the circuit board of a miniature radio transceiver. The antenna is ideally suited for use in applications where radio frequency inventory tags (operating in the high VHF to low UHF frequency ranges of 400 to 500 mHz) are associated with items for which a high level of inventory control is required. It is important that such tags be able to communicate with vertical and horizontal polarized signals with reasonable gain. This invention features a low cost for manufacture and has application in radio communications in general wherever there is a requirement for a small transceiver with an integrated, orientation insensitive antenna.

8 Claims, 4 Drawing Sheets

OTHER PUBLICATIONS

"RADEL II™ —A Radio Label Method for Container Manifesting" Project Status Report, (Phase II) dated Nov., 1995, 23 pages.

"RADEL II™ —A Radio Label Method for Container Manifesting" Final Report (Phase II), dated Apr., 1996, 36 pages.

SMALL OMNI-DIRECTIONAL, SLOT ANTENNA

CROSS REFERENCE TO RELATED APPLICATIONS

This application claims priority under 35 USC §119 of provisional application Ser. No. 60/033,115 filed Dec. 18, 1996.

This invention was made with Government support under Contract N47408-94-C-7412 awarded by Naval Facilities Contracting Office, Port Hueneme, Calif. 93043. The Government has certain rights in this invention.

BACKGROUND OF THE INVENTION

Miniature VHF-UHF portable radio receivers commonly use antennas of loop design arranged either as a single loop around the radio housing or as an internal loop concealed inside the radio housing. U.S. Pat. No. 3,736,591 issued to Rennels, et al, is an example of a loop antenna. The loop antennas are economical to manufacture and may be efficiently integrated into the radio package. However, their lack of omni-directionality generally limits their application to receivers used for personal communication such as, for example, paging devices and personal radios. The lack of omni-directional capability is acceptable in these applications as the user normally has freedom to reorient the radio to optimize reception.

Adapting these antenna designs to inventory tag application has not been successful since a tag on a stored or warehoused item maintains a fixed location and position. That is, its tag is unable to freely reorient itself to improve reception. Tags are installed on packages which are placed in warehouses, shipping containers or pallets and where the emphasis is on efficient use of storage space and not on optimizing radio communications. In addition if the package is moved, a tag that was in can an optimal communication position may be placed in a less favorable orientation. Since the tag is immobile, the lack of an omni-directional antenna greatly affects the utility of the tag. Also, in many circumstances, tags may be placed in "blind spots", where communication using conventional loop antennas is difficult due to shadowing or other obstructive influences.

To address this problem, radio tags used for inventory control ideally incorporate omni-directional antennas which provide good communications without regard to orientation. One such antenna is described in U.S. Pat. No. 5,485,166, "An Efficient Electrically Small Loop Antenna With A Planar Base Element" issued to Verma et al and assigned to the same assignee as the present invention. This patent discloses a loop antenna on a planar base element that has been shown to provide extremely efficient omni-directional communications. However, the three dimensional design of the antenna makes it unsuitable for many applications. Using such loop antennas (and similar omni-directional designs) for inventory tag applications requires a physical design that has substantial measurements in three dimensions. Applications involving tagging of large or non-uniform objects (for example, a vehicle) are served well by these existing designs since the tag adds little to the bulk of the object being tagged. For small or tightly packed items, however, these tag designs are not well suited as they simply take up too much space.

Slot antennas generally would appear to be a good choice for radio frequency inventory tag applications. Slot antennas are commonly used in high frequency radio bands (greater than 1 GHz) and typically feature slot lengths on the order of one-half wave length (½ λ), which at these frequencies is approximately 6 inches. While such dimensions may be acceptable in physically large applications such as aircraft communications where the antenna fits within the skin of the aircraft, they are not suitable for a small portable receiver. To use conventional slot antenna designs in the VHF-UHF band (approximately 500 MHz), the ½ λ slot length would be on the order of 12 inches. Thus, dimension requirements generally preclude conventional slot antennas from being used in inventory tag applications.

As discussed above, one of the necessary characteristics of an antenna intended for radio frequency inventory tag applications is omni-directionality. That is, the tag transceiver must be capable of good operation in any orientation. Prior art slot antennas developed for omni-directional pattern employ either a circular array or a cross-slot arrangement of the elements, the antenna being excited or driven either from a cavity underneath the antenna or from sources isolated from the antenna. This form of antenna design is undesirable for a radio frequency inventory tag application due to the size of the cavity or external placement of the drive means.

Designs in the prior art for miniature receivers have used slot type antennas; however, these have been formed on the edge of a thin receiver housing. For example, see U.S. Pat. No. 4,935,745 issued to Mori, et al. Such designs, although claiming efficiency of packaging, are sensitive to nearby structures or bodies due to their presence on the edge of the receiver housing and thus require careful placement for efficient performance. In addition, these designs, while providing an inexpensive case design often separate the transceiver electronic circuits from the antenna, thus requiring extra manufacturing steps in the form of lead wire insertion and soldering to bring the two elements to electric conjunction.

Another prior design, as disclosed in U.S. Pat. No. 4,975,711 to Kang-Hoon Lee and assigned to Samsung Electronic Company, provides for a slot antenna structure that is omni-directional by placing the antenna slots in orthogonal planes with coaxial cable connecting the slots together and to the receiver electronic circuits. Such a design is high in manufacturing costs due to the cable connections required during assembly. In addition, the design suffers from the proximity of the antenna structure to the receiver holding structure or body.

As has been discussed, the present state of antenna art does not provide for a small, flat, omni-directional antenna that is suitable for low cost, easily manufactured miniature tag transceivers. It is this deficiency that is addressed with the present invention.

SUMMARY OF THE INVENTION

Therefore, an object of this invention is to provide RF inventory tags which have a flat form or thin profile, compatible with the flat form of the radio circuit board.

Another object of the invention is to provide an antenna integrated within the transceiver board for ease and economy of manufacture.

Still another object of this invention is to provide an antenna which enables a tag design of small dimensions.

Other objectives and advantages will in part be obvious and will in part appear hereinafter, and will be accomplished by the present invention which provides an omni-directional slot antenna comprising a circuit board having a first dimension and a second dimension perpendicular to the first dimension. Electronic circuitry which receives and/or transmits RF signals is mounted to the circuit board. Typically, the electronic circuitry will also include an electronic circuit or network to match the impedance between the antenna and the receiving/transmitting circuitry. A first slot antenna arm is found in the circuit board parallel to the first dimension and a second slot antenna arm is found in the circuit board parallel to the second dimension with one end of the first slot antenna arm connected or joined to the second slot antenna arm at a selected location and perpendicular with the second slot antenna arm so as to form, for example, a "L" shaped slot antenna or alternatively a "T" shape slot antenna. An antenna ground plane is formed on the circuit board so as to surround both the first and second slot antenna arms.

The antenna of the present invention is a short slot antenna having a length of one-tenth wave length and which can be used in the VHF-UHF frequency range with excellent performance. The short slot antenna of the present invention overcomes the deficiencies of the prior art by incorporating the antenna as an integral part of the transceiver circuit board, allowing the transceiver housing to provide immunity from radiation field distortion and interference, regardless of receiver orientation. An added benefit is that no wire or other electrical connections are required between the transceiver electronic circuits and a separated antenna and their housing, thus simplifying the manufacture of the transceiver. The thickness of the final product is thus minimally greater than the transceiver circuit board. The antenna has a three dimension, omni-directional pattern, able to communicate vertical and horizontal polarization signals with reasonable gain. When the antenna is constructed as an "L" shaped slot placed on two edges of the circuit board, there is sufficient space left on the board for the transceiver circuits to be mounted.

Thus, the antenna exhibits a three dimension omni-directional pattern without using complex structures such as arrays or two slots in a cross pattern. For example, the L-slot antenna is built as two arms orthogonal to each other, in association with a flat conductor in the plane of and surrounding the antenna slots to direct the current flow path so as to form a three dimension omni-directional radiation pattern. The design requires only a single feed point connecting the transceiver to the antenna, thus greatly simplifying the structure and reducing the cost compared to arrays or cross slot antennas.

The simple matching network matches the antenna impedance to the transceiver port. Selection of the Q value of the matching network provides means for adjusting the bandwidth for compatibility with various communication requirements.

From the above advantages of this invention, many applications for small size portable RF communication transceivers exist, especially where three dimension omni-directional pattern is needed.

DESCRIPTION OF THE DRAWINGS

The above mentioned features of the present invention will be more clearly understood from consideration of the following description in connection with the accompanying drawings in which.

DESCRIPTION OF THE PREFERRED EMBODIMENT

Figure 1:
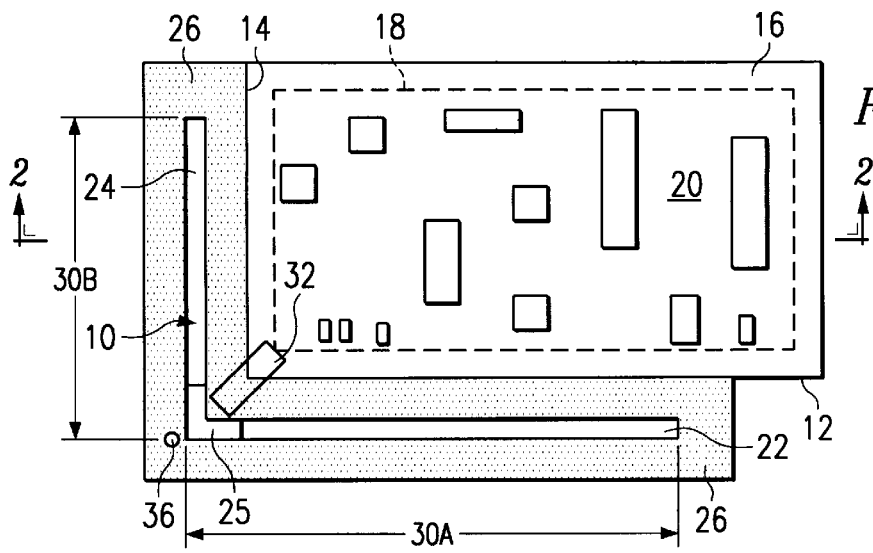
FIG. 1 is a top or plan view of an embodiment of the present invention showing the slot antenna in a printed circuit board containing the transceiver electronic circuit.
Figure 2:
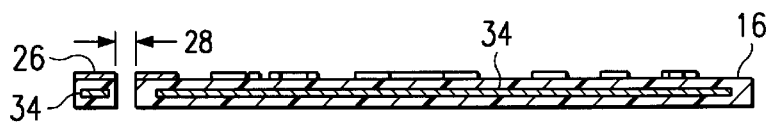
FIG. 2 is a view taken through section 2—2 of the preferred embodiment transceiver board showing the flat form factor of the complete transceiver and antenna and the antenna and electronic circuit ground planes.

Referring now to FIGS. 1 and 2, there is shown one embodiment of the present slot-antenna invention having an "L" shape. The "L" shaped slot-antenna 10 is shown located along the side edge 12 and end edge 14 of the circuit board 16. Transceiver electronic circuit generally identified at 18 is shown mounted to a top surface 20 of circuit board 16. Antenna arms 22 and 24 are formed as punched slots in circuit board 16. To provide mechanical strength, the corner junction 25 of the antenna arm slots 22 and 24 is not punched. Surrounding both antenna slot arms 22 and 24 is the antenna ground plane 26.

As will be appreciated by those skilled in the art, the dimensions of the slot antenna arms 22 and 24 respectively will be selected according to the desired receiving and transmitting frequency and the desired antenna length following techniques common in the art. According to one embodiment the antenna is intended for application to a miniature radio tag operating at 433.92 Mhz. For this application, the dimensions of the slot antenna are 4.42 inches long (this is the overall length and represents the combined length of slot arms 22 and 24 and indicated by dimension 30A and 30B) by 0.180 inches wide (indicated by dimension 28). Slot antenna dimensions may be calculated as discussed in J. D. Kraus, "ANTENNAS" second edition (McGraw-Hill, 1988), Chapter 13, and incorporated herein by reference. The impedance of the slot antenna 10 is matched to the transceiver impedance by matching network 32. Although those skilled in the art readily understand how to design a network 32 for matching the impedance of slot antenna 10 and transceiver 18, a discussion of how to design such an impedance network 32 is provided in Kraus, Chapter 13 as discussed above and in R. C. Johnson, editor, "ANTENNA ENGINEERING HANDBOOK" third edition (McGraw-Hill, 1993), Chapters 7 and 43, and incorporated herein by reference.

Referring to FIG. 2, the antenna ground plane 26 is fabricated on the surface of circuit board 16 and is separated from electronic circuit ground plane 34. Circuit ground plane 34 is fabricated by conventional means as an internal layer within circuit board 16. Antenna ground plane 26 is connected to electronic circuit ground plane 34 by a single connection at transition point 36 and, as discussed above, to the electronic circuit 18 by impedance matching network 32. Thus, the antenna 10 and the electronic circuit 18 have a common ground only at the one point 36. The antenna current is thus prevented from spreading uncontrolled in the area of the circuit ground thereby providing control of the antenna radiation pattern. An additional benefit of the single connection point 36 is to provide control between the antenna ground current and the transceiver ground current thereby effectively avoiding spurious coupling.

Figure 3A:
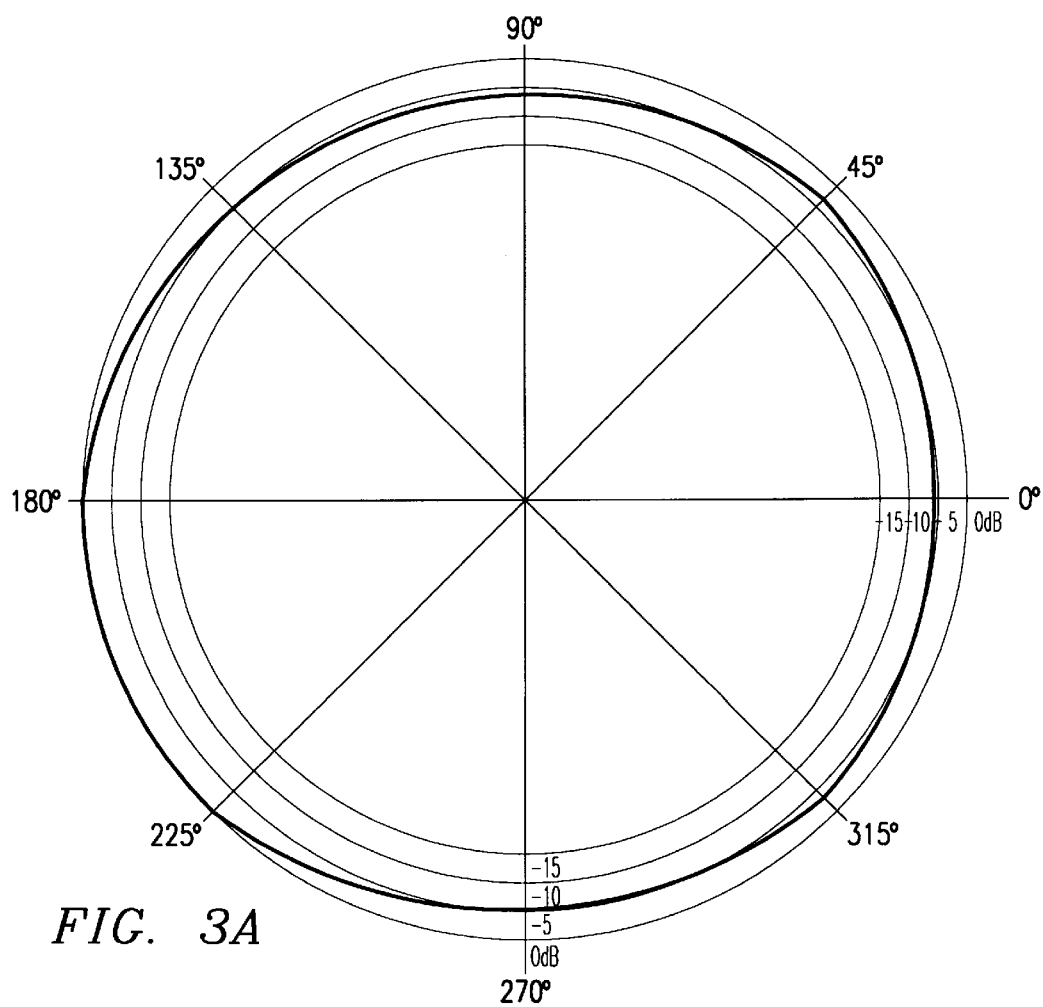
FIGS. 3A and 3B show the normalized power radiation pattern of the antenna in the X-Z plane.
Figure 3B:
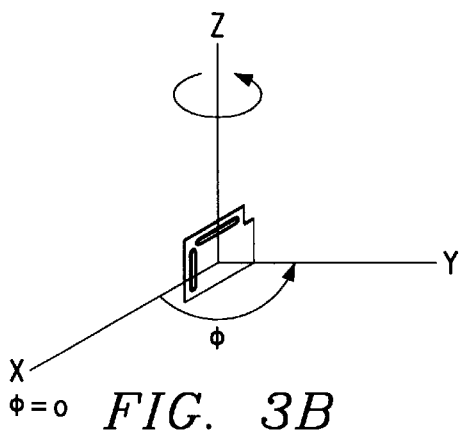
Figure 4B:
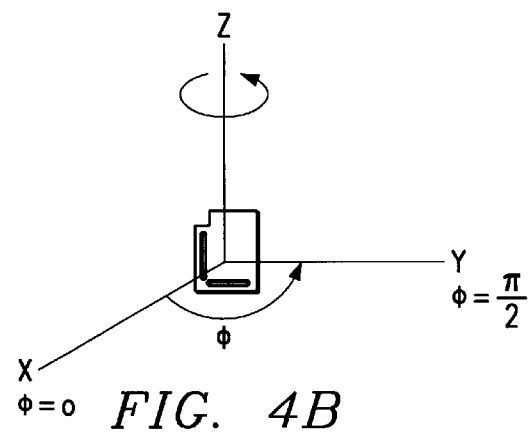
FIGS. 4A and 4B show the normalized power radiation pattern of the antenna in the Y-Z plane.
Figure 4A:
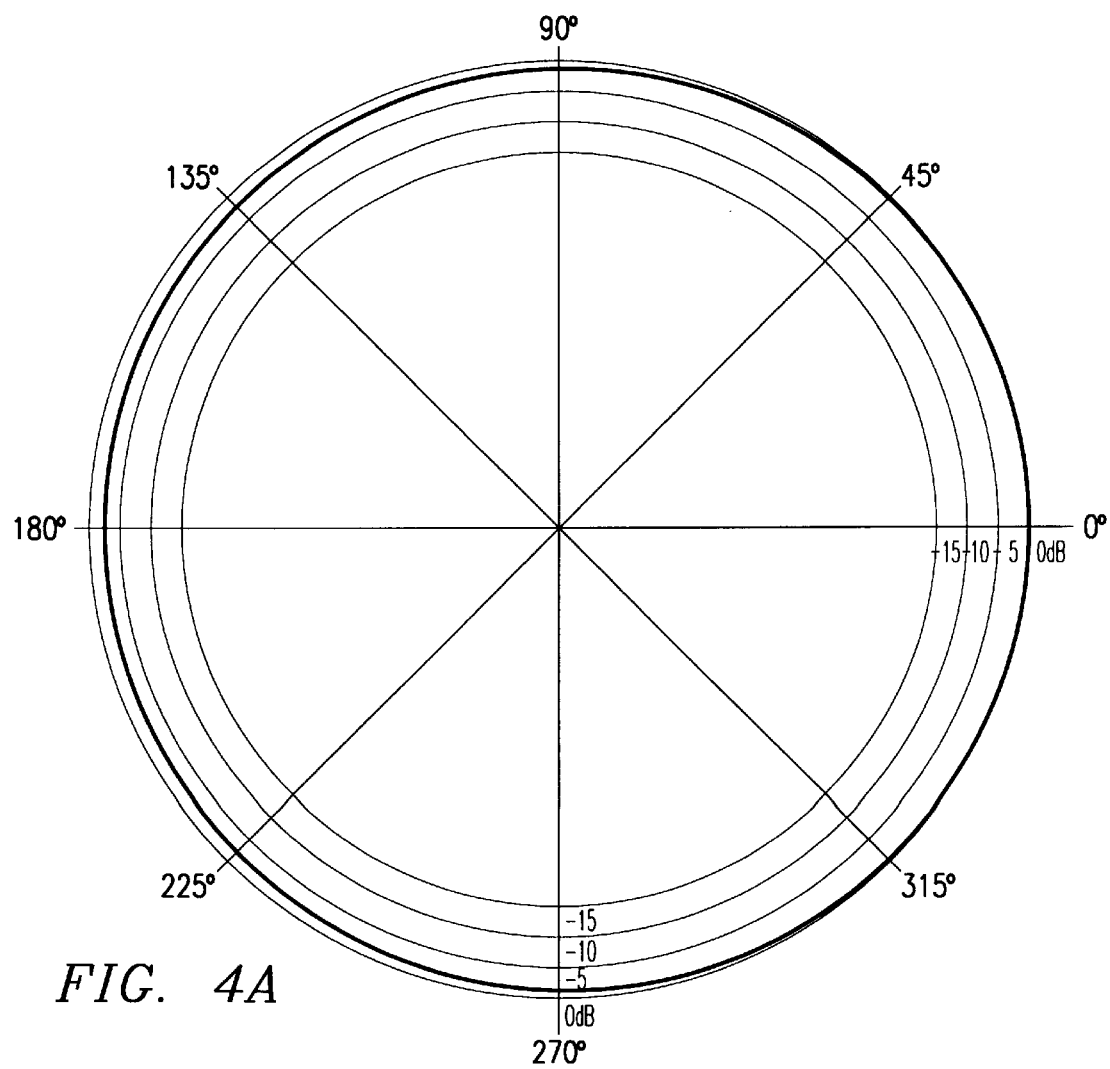
Figure 5A:
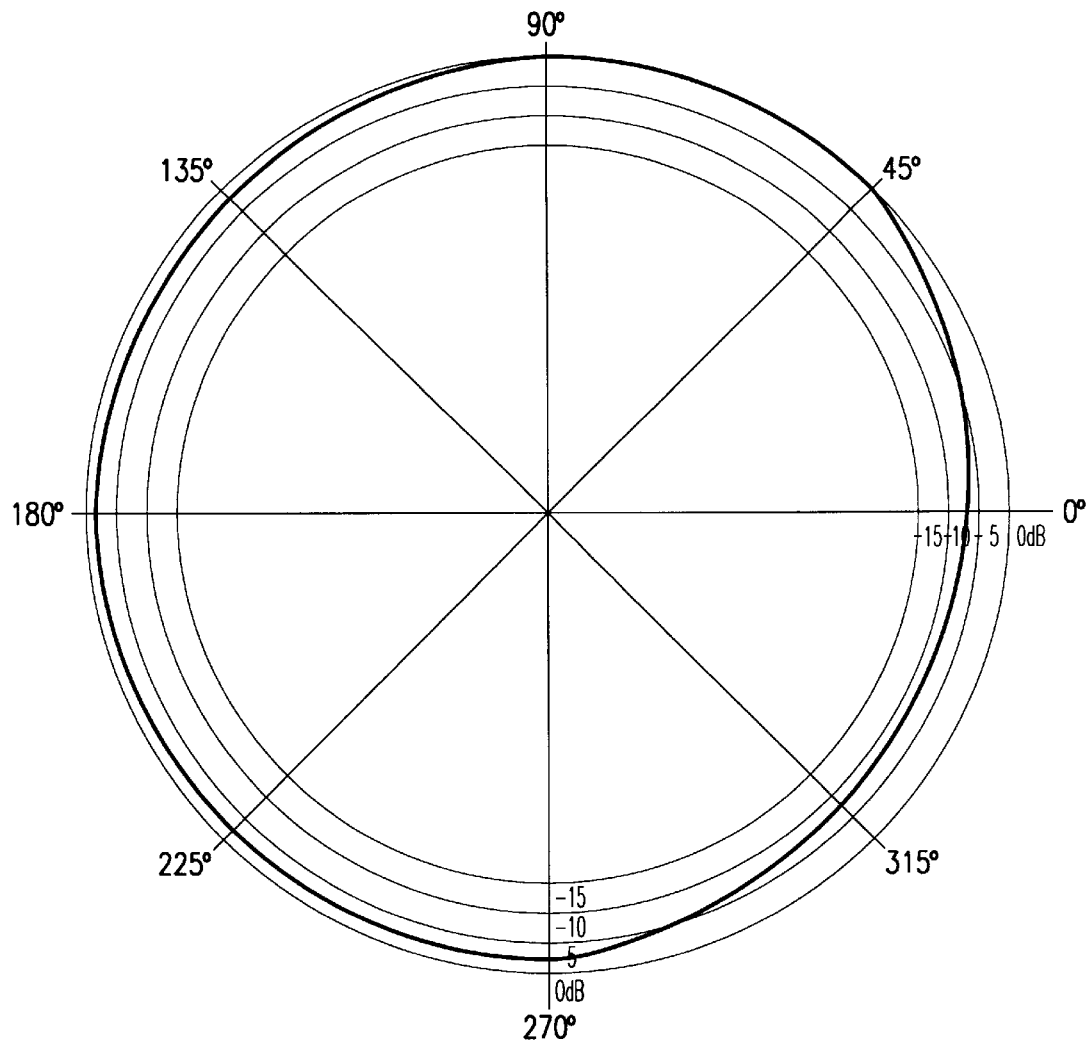
FIGS. 5A and 5B show the normalized power radiation pattern of the antenna in the X-Y plane.
Figure 5B:
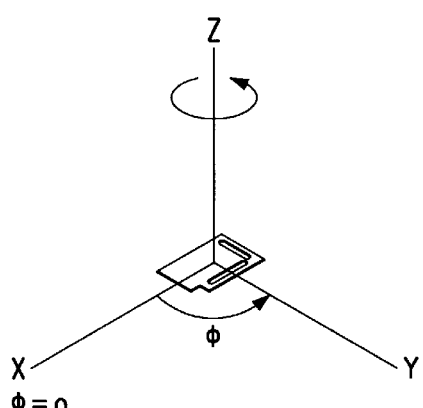

As already discussed, to reduce dielectric loss, the antenna slots 22 and 24 are formed as cutouts in the circuit board 10 and are surrounded by antenna ground plane 26. The joining area 25 of slots 22 and 24 remains as solid material of the circuit board 10 to provide mechanical strength. The antenna current flowing around the slots in association with the electric field crossing the slots forms a three dimension omni-directional radiation pattern, the performance of which is depicted in FIGS. 3A and 3B, 4A and 4B, and 5A and 5B. FIGS. 3A and 3B show the radiation pattern in the X-Z plane; FIGS. 4A and 4B show the radiation pattern in the Y-Z plane and FIGS. 5A and 5B show the radiation pattern in the X-Y plane.

The length and width of slots 22 and 24 and ground plane 26 are optimized to provide the best possible gain for the design frequency and transceiver size of the preferred embodiment.

Figure 6:
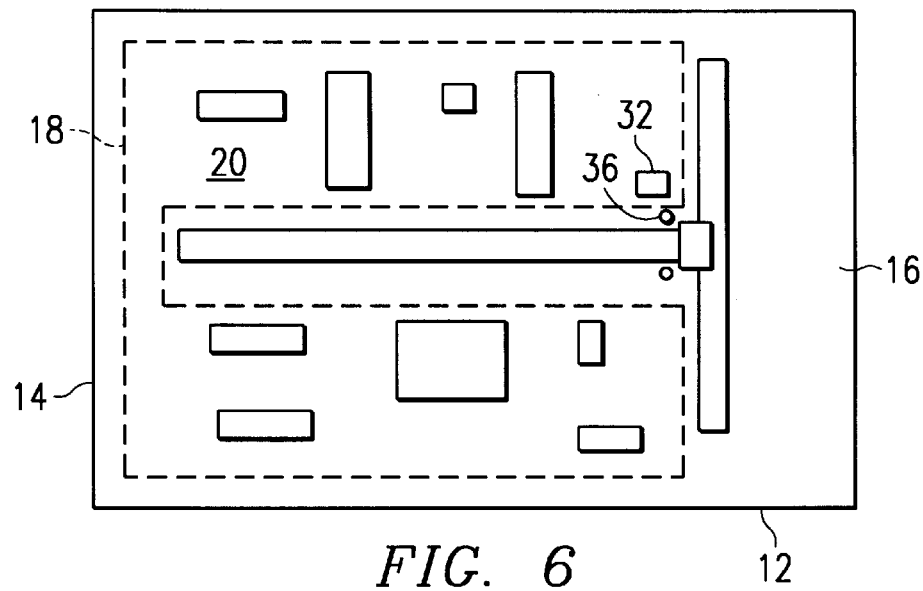
FIG. 6 shows an alternate embodiment of the invention wherein the slot is in the shape of a "T".

An alternate design for the slot antenna is of a T form wherein the antenna slots are arranged as a "T" as disclosed in FIG. 6. Those components common to the embodiment of FIG. 1 carry the same reference numbers. This design produces almost the same radiation pattern as the L design of FIGS. 1 and 2, the difference being a slightly more symmetrical radiation pattern at the expense of a divided circuit component area. The T design antenna may effectively be employed in transceiver designs where it is necessary to provide greater physical separation for circuit components or sections than that afforded by the L shape design. The T slot design also exhibits a slightly improved gain since there is no requirement for a discontinuity in the slot cutout for mechanical rigidity.

Figure 7:
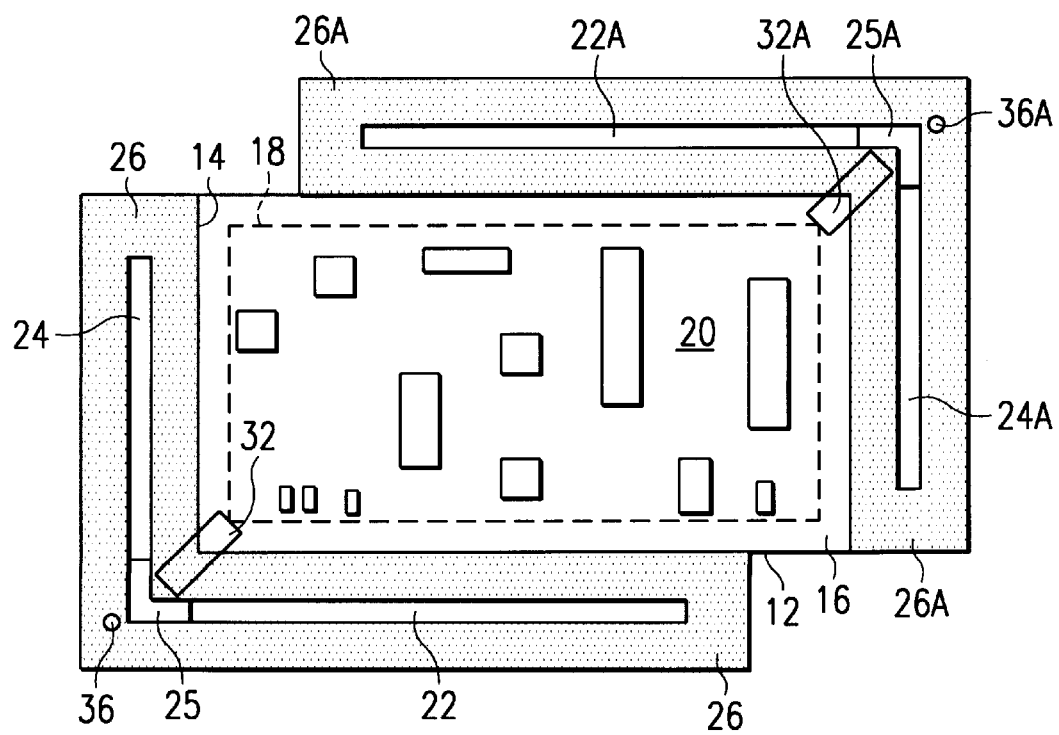
FIG. 7 shows a circuit board having two "L" shaped slot-antennas for two different operating frequencies.

Referring to FIG. 7, there is shown an embodiment of a dual frequency transceiver wherein two slot antennas, each similar to that discussed with respect to FIGS. 1 and 2, are provided on the transceiver circuit board, one for each of the operating frequencies. Those components of the second slot antenna corresponding to components of the first slot antenna carry the same reference number, except the suffix "A" has been added. Placing the antenna structure on the board edges in diametric opposition allows the two structures to coexist with minimal interference.

Therefore, it will be appreciated that this has been described a combination of an omni-directional slot antenna and connected electronic circuitry on a printed circuit board. Further, the present invention has been described with respect to specific embodiments and it is not intended that such specific references be considered as limitation on the scope of this invention except as set forth in the following claims.

We claim:

1. A combination omni-directional slot antenna and electronic circuitry comprising:

a circuit board having a first selected dimension and a second selected dimension substantially perpendicular to said first dimension;

electronic circuitry mounted to said circuit board, said electronic circuitry including at least one of receiving and transmitting circuitry and a first impedance matching network;

a first slot antenna arm formed in said circuit board parallel to said first dimension;

a second slot antenna arm formed in said circuit board parallel to said second dimension, one end of said first slot antenna arm joined to a selected location of said second slot antenna arm such that said first slot antenna arm is substantially perpendicular to said second slot antenna arm and forms said first omni-directional slot antenna, said first impedance matching network connected between said first omni-directional slot antenna and said at least one of said receiving and transmitting circuitry; and an antenna ground plane formed on said circuit board and surrounding both said first and second slot antenna arms.

2. The combination antenna of claim 1 wherein said first slot antenna arm is formed along one edge of said circuit board and said second antenna arm is formed along an adjoining edge of said circuit board such that said first and second antenna arms form a substantially "L" shaped slot antenna.

3. The combination antenna of claim 2 and further including a portion of said circuit board located where said first slot antenna arm joins said second slot antenna arm to provide mechanical strength.

4. The combination antenna of claim 1 wherein said one end of said first slot antenna arm is joined to an end of said second slot antenna arm such that said first and second antenna arms substantially form an "L" shaped slot antenna.

5. The combination antenna of claim 1 wherein said first slot antenna arm is joined to said second slot antenna arm at a selected location between the two ends of said second antenna arm and that said first and second antenna arms substantially form a "T" shaped slot antenna.

6. The combination antenna of claim 1 and further including an electronic circuit ground plane provided with said circuit board and a single electrical connection between said antennas ground plane and said electronic circuit ground plane.

7. The combination antenna of claim 6 wherein said electronic circuit ground plane is formed as an integral layer within said circuit board.

8. The combination of claim 2, wherein said first impedance matching network is connected to said receiving circuitry, and further including a third slot antenna arm formed in said circuit board at an edge parallel to and opposite said first slot antenna arm; a fourth slot antenna arm formed in said circuit board at an edge parallel to an opposite said second slot antenna arm, one end of said third slot antenna arm joined to an end of said fourth slot antenna arm such that said third and fourth antenna arm form a second substantial "L" shaped slot antenna; a second antenna ground plane formed on said circuit board and surrounding said third and fourth slot antenna arms; and wherein said electronic circuitry includes a second impedance matching network to match the impedance of said second "L" shaped slot antenna to said transmitting circuitry.

* * * * *